(12) United States Patent
Chen et al.

(10) Patent No.: US 7,291,562 B2
(45) Date of Patent: Nov. 6, 2007

(54) METHOD TO FORM TOPOGRAPHY IN A DEPOSITED LAYER ABOVE A SUBSTRATE

(76) Inventors: Yung-Tin Chen, 4190 Tobin Cir., Santa Clara, CA (US) 95054; Samuel V Dunton, P.O. Box 730002, San Jose, CA (US) 95173

( * ) Notice: Subject to any disclaimer, the term of this patent is extended or adjusted under 35 U.S.C. 154(b) by 69 days.

(21) Appl. No.: 11/298,015

(22) Filed: Dec. 9, 2005

(65) Prior Publication Data
US 2007/0134923 A1    Jun. 14, 2007

(51) Int. Cl.
*H01L 21/302* (2006.01)
(52) U.S. Cl. .............. 438/692; 438/692; 438/633; 438/637; 438/687; 438/704; 438/740; 438/745
(58) Field of Classification Search ............ 438/692
See application file for complete search history.

(56) References Cited

U.S. PATENT DOCUMENTS 5,639,697 A * 6/1997 Weling et al. ............ 438/633

6,486,066 B2   11/2002 Cleeves et al. ............ 438/692

OTHER PUBLICATIONS

U.S. Appl. No. 10/883,417, filed Jun. 30, 2004, Raghuram et al.
U.S. Appl. No. 11/097,496, filed Mar. 31, 2005, Chen et al.

* cited by examiner

*Primary Examiner*—Nadine Norton
*Assistant Examiner*—Maki Angadi

(57) ABSTRACT

In the present invention a dummy structure is formed in a first deposited layer in order to create topography, generally a raised area, in a deposited layer formed above and later than the first deposited layer. This topography may be advantageous in later steps. In one embodiment, transferred topography allows an alignment or overlay mark obscured by an opaque layer to be located by this enhanced topography. In another embodiment, a raised volume of dielectric material prevents features at the outside of an array area from being overpolished during a CMP step. This method may prove useful in other contexts as well. The size, shape, and placement of the dummy structure is tailored to form the desired excess volume.

20 Claims, 8 Drawing Sheets

METHOD TO FORM TOPOGRAPHY IN A DEPOSITED LAYER ABOVE A SUBSTRATE

BACKGROUND OF THE INVENTION

The invention relates to a method to create topography in deposited layers.

Chemical-mechanical planarization (CMP) is frequently used to polish and planarize deposited and/or patterned surfaces during fabrication of an integrated circuit. In general, topography formed in surfaces during fabrication is undesirable. Photolithography is most accurate when depth of field is minimized; thus in general it's best to minimize topography to improve uniformity of patterned features formed on the surface. There are occasions during fabrication of an integrated circuit, however, when some topography may be advantageous, most often when this topography is outside of an array area. For example, transferred topography may be used to locate alignment and overlay marks buried beneath deposited layers. As will be described, in other instances, the presence of some topography may actually improve uniformity.

It is advantageous in some circumstances, therefore, to create topography in deposited layers in an integrated circuit.

SUMMARY OF THE PREFERRED EMBODIMENTS

The present invention is defined by the following claims, and nothing in this section should be taken as a limitation on those claims. In general, the invention is directed to methods to control topography in deposited layers during fabrication of an integrated circuit.

A first aspect of the invention provides for a method to create topography in material deposited above a wafer substrate, the method comprising: etching a first deposited layer to form a dummy structure above the substrate, the dummy structure adapted to form excess dielectric volume on top of the dummy structure during dielectric deposition; depositing first dielectric material having a top surface above the first deposited layer, wherein a first height of the top surface of first dielectric material directly above the dummy structure is higher above the substrate than a second height of the top surface of first dielectric material adjacent to the dummy structure; performing a first CMP step on the first dielectric material, wherein, after the first CMP step, the first height remains higher than the second height; and, after the first CMP step, depositing a second layer having a top surface above the first dielectric material, wherein a third height of the top surface of the second layer directly above the dummy structure is higher above the substrate than a fourth height of the top surface of the second layer adjacent to the dummy structure.

A preferred embodiment of the invention provides for a method to locate a buried overlay or alignment structure, the method comprising: forming a dummy structure in a first deposited layer; depositing first dielectric material above the dummy structure, the first dielectric material having a top surface; performing a first CMP step on the first dielectric material, wherein, after the first CMP step, the top surface of the first dielectric material has a first height directly above the dummy structure and a second height adjacent to the dummy structure, the first height greater than the second height; forming the overlay or alignment structure directly above the dummy structure and above the first dielectric material; depositing a second layer having a top surface above the overlay or alignment structure, wherein the top surface of the second layer has a third height directly above the overlay or alignment structure and a fourth height adjacent to the overlay or alignment structure, the third height greater than the fourth height; and locating the overlay or alignment mark by identifying a boundary between the third height and the fourth height.

Another preferred embodiment provides for a method to produce topography in material deposited above a wafer substrate, the method comprising: depositing a first layerstack; etching the first layerstack to form first features in an array area and a dummy structure outside of the array area; depositing first dielectric material over the first features and the dummy structure; planarizing the first dielectric material to expose the first features wherein, after the planarizing step, a first thickness of dielectric material remains directly on top of the dummy structure; depositing a second layerstack above the first features and the dummy structure; patterning and etching the second layerstack to form second features; and depositing second dielectric material having a top surface above the second features and the dummy structure, wherein the top surface of second dielectric material has a first height directly above the dummy structure and a second height adjacent to the dummy structure, the first height higher above the substrate than the second height.

Yet another preferred embodiment provides for a method to create topography in material deposited above a wafer substrate, the method comprising: etching a first deposited layer to form a dummy structure and first patterned features above the substrate, the dummy structure adapted to form excess dielectric volume on top of the dummy structure during dielectric deposition; depositing first dielectric material having a top surface above the first deposited layer, wherein a first height of the top surface of first dielectric material directly above the dummy structure is higher above the substrate than a second height of the top surface of first dielectric material adjacent to the dummy structure; removing overfill of dielectric material to expose the first patterned features wherein, after the step of removing overfill, the first height remains higher than the second height; and, after the step of removing overfill, depositing a second layer having a top surface above the first dielectric material, wherein a third height of the top surface of the second layer directly above the dummy structure is higher above the substrate than a fourth height of the top surface of the second layer adjacent to the dummy structure.

Each of the aspects and embodiments of the invention described herein can be used alone or in combination with one another.

The preferred aspects and embodiments will now be described with reference to the attached drawings.

DETAILED DESCRIPTION OF THE PREFERRED EMBODIMENTS

Dielectric fill is widely used in semiconductor devices to provide electrical insulation between active structures and conductors, and to provide structural support for such structures. There are many types of dielectric fill which may be deposited in various ways.

A high-density plasma (HDP) method is frequently used to deposit various types of dielectric fill, including oxides, notably silicon dioxide.

Active features in an integrated circuit may be formed by Damascene techniques, in which a volume of dielectric material is deposited, trenches and voids etched in the dielectric material, and the trenches or voids filled with metal or semiconductor. Overfill of metal or semiconductor is removed, usually by CMP, completing the Damascene features. Alternatively, active features may be formed by a subtractive method, in which layers such as metal or semiconductor are deposited, then patterned and etched, leaving behind patterned features. Dielectric fill is then deposited between the patterned features, filling gaps between them.

Figure 1A:
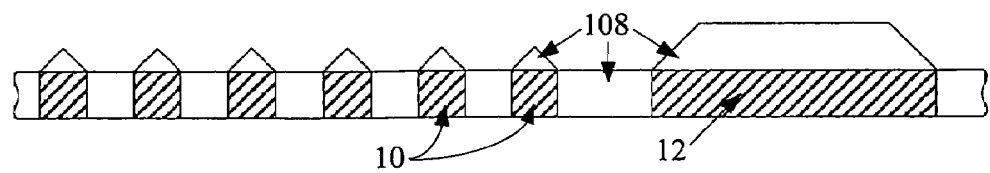
FIGS. 1a-1c are cross-sectional views describing the behavior of certain kinds of dielectric material when deposited over patterned features.

When dielectric material is deposited over patterned features, the shape and volume of the deposited material above those features varies with the deposition method and with the size, shape, and distribution of the patterned features. For example, turning to FIG. 1a, when HDP dielectric 108 is deposited over patterned features, sputtering tends to cause the volume of deposited dielectric on top of the features to be angled at the feature edges. For a time, the height of the dielectric volume on small features will not increase above the height where these angled edges meet. On smaller features like features 10, then, a small peak forms, while on larger features, in the center of the feature where more of the dielectric volume has a flat, rather than an angled surface, a larger volume forms.

Figure 1B:
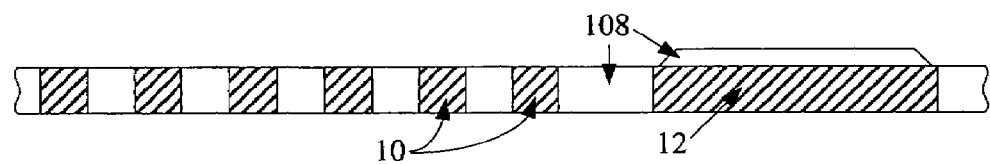
Figure 1C:
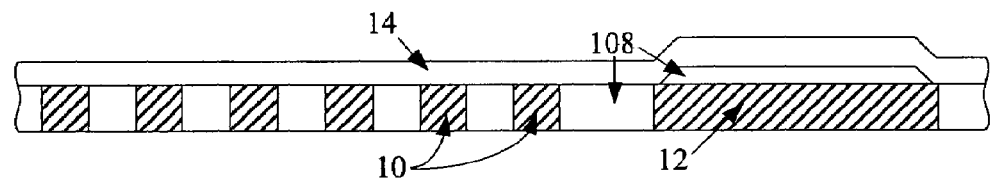

If, in the next step, features 10 are to be exposed, overfill of dielectric is then removed by various methods, for example by CMP. Depending on the relative size and shape of the patterned features, and the style and degree of CMP used, an excess volume of dielectric may remain on larger feature 12 even after all of the dielectric is removed from on top of smaller features 10, as in FIG. 1b. When, as in FIG. 1c, additional layers 14 are deposited over features 10 and 12, topography will be created in those layers directly above the excess dielectric volume. This topography may be transferred through several deposited layers.

Occasions arise in which this topography is advantageous. Thus in the present invention, a dummy structure is formed to create such topography, in the form of an elevated region, in later deposited layers. For purposes of this discussion, a dummy structure is a structure which has no function other than to occupy space. As will be described, this topography may be useful during fabrication only, and thus may or may not exist in the finished device.

Two embodiments of the present invention will be described, in which dummy structures are formed to produce topography in later deposited layers. Both of these embodiments will be described in the context of a monolithic three dimensional memory array like the one taught in Herner et al., U.S. Pat. No. 6,952,030, "High-Density Three-Dimensional Memory Cell," hereinafter the '030 patent, owned by the assignee of the present invention and hereby incorporated by reference.

In the memory array of the '030 patent, multiple memory levels are formed above a substrate, stacked atop one another. A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

Figure 2:
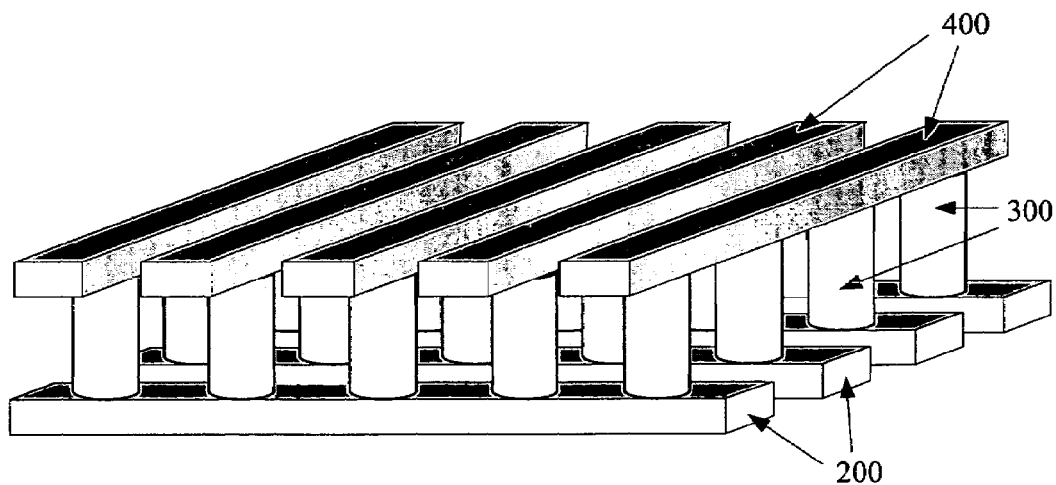
FIG. 2 is a perspective view of a memory level formed according to U.S. Pat. No. 6,952,030.

A first memory level of the type described in the '030 patent is shown in FIG. 2. Bottom conductors 200 and top conductors 400 extend in different directions, preferably perpendicular to each other. Each pillar 300 is disposed between one of the bottom conductors 200 and one of the top conductors 400. A memory cell includes a portion of a bottom conductor 200, a pillar 300, and a portion of a top conductor 400. Each pillar 300 includes a vertically oriented semiconductor junction diode. In preferred embodiments the structure of FIG. 2 is formed in three subtractive steps: 1) a conductive layerstack is deposited, patterned and etched to form bottom conductors 200; then, after fill and CMP to expose the top surface of bottom conductors 200, 2) a semiconductor layerstack is deposited, patterned and etched to form pillars 300; and, finally, after fill and CMP to expose the top surface of pillars 300, 3) a conductive layerstack is deposited, patterned and etched to form top conductors 400.

Many details regarding fabrication of this monolithic three dimensional memory array are provided in the '030 patent, as well as in related arrays described in Herner et al., U.S. patent application Ser. No. 10/955,549, "Nonvolatile Memory Cell Without a Dielectric Antifuse Having High- and Low-Impedance States," filed Sep. 29, 2004; in Herner et al., U.S. patent application Ser. No. 11/015,824, "Nonvolatile Memory Cell Comprising a Reduced Height Vertical Diode," filed Dec. 17, 2004; and in Chen et al., U.S. patent application Ser. No. 11/097,496, "Masking of Repeated Overlay and Alignment Marks to Allow Reuse of Photomasks in a Vertical Structure," filed Mar. 31, 2005. To avoid obscuring the invention, many of these details will be omitted in this discussion; it will be apparent to those skilled in the art, however, that no teaching from any of these incorporated patents or patent applications is intended to be excluded.

While these embodiments are described in the context of a monolithic three dimensional memory array, it will be apparent to those skilled in the art that the utility of the present invention is in no way limited to memory or to stacked monolithic structures. These methods may be used in formation of device levels that do not include memory cells, and are not memory levels.

EXAMPLE

First Embodiment

During fabrication of an integrated circuit using subtractive methods, patterned features are conventionally formed using photolithography and etch techniques. To pattern using photolithography, a photomask, which transmits light in some areas and blocks it in others, is formed, the blocking areas corresponding to the pattern (or its inverse) to be formed on the wafer surface. The surface to be patterned, for example a semiconductor, conductive, or dielectric layer, is covered with a layer of photoresist, a photoreactive material. Light is projected onto the photoresist surface using the photomask, selectively exposing areas of photoresist. The wafer is then subjected to a developing process, in which exposed photoresist (or unexposed photoresist, in the case of negative photoresist) is removed, leaving patterned photoresist behind. The remaining patterned photoresist then typically serves to protect underlying material during a subsequent etch process, creating features in the same pattern as the remaining photoresist.

Formation of a typical integrated circuit will include the use of multiple photomasks, each defining a pattern, each of which must be aligned to the wafer with considerable precision. In some cases, each successive photomask is aligned to a single reference mark on the wafer. In other cases, however, over time this initial reference mark becomes obscured or otherwise undetectable. In this case, each layer can be aligned to a previous patterned layer, ideally the layer formed immediately before it. This form of alignment is called layer-to-layer alignment.

Reference marks used to accomplish and confirm alignment of a photomask come in two types: alignment marks and overlay marks.

Figure 3:
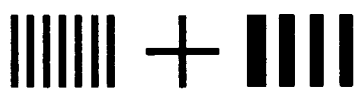
FIG. 3 is a plan view of a typical alignment mark.

The actual shapes of alignment mark and overlay marks vary according to the manufacturer. FIG. 3 shows a typical alignment mark. Elements of the photolithography alignment system, such as the stepper, for example, look for this alignment mark formed in a previous layer and place the photomask in relation to it.

Figure 4A:
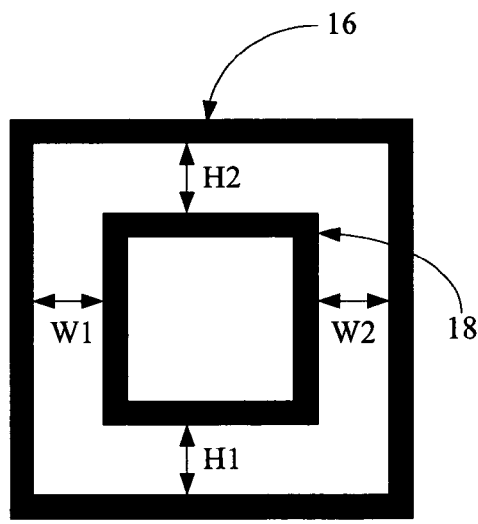
FIGS. 4a and 4b are top views illustrating use of overlay marks to identify misalignment.
Figure 4B:
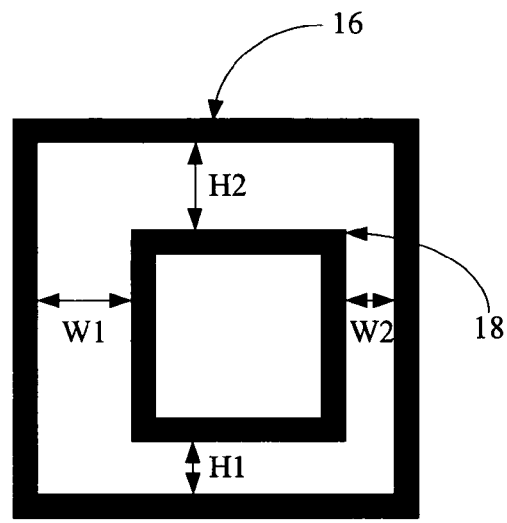

After a photomask has been used to expose photoresist and the photoresist has been developed, creating patterned features in the photoresist, a measurement is taken to determine how well the photomask was actually aligned to the reference layer. This measurement is done using overlay marks, which are typically formed in pairs. A target overlay mark is formed in the target layer, the layer being aligned to, while a measured overlay mark is formed in the current layer being aligned. The measured overlay mark, when used for measurement, is formed in photoresist, and is also sometimes referred to as a resist-defined target mark. FIG. 4a shows a typical target overlay mark, outer frame 16, and a typical measured overlay mark, inner frame 18. If alignment was perfect, as in FIG. 4a, inner frame 18 is precisely centered in outer frame 16, and dimensions H1 and W1 are the same as dimensions H2 and W2. If alignment was imperfect, as in FIG. 4b, inner frame 18 is not centered in outer frame 16, and H1 and H2, or W1 and W2, will be different.

Alignment marks and overlay marks are formed outside of the active device area of each die, typically in the scribe lines where the dice will ultimately be cut apart to separate them.

Overlay and alignment marks, however, may not always be readily visible. Recall that an alignment mark is formed during etch of a first layer, and is to be used to position the photomask prior to forming the next layer to be etched. Thus when the photomask is ready to be aligned to the alignment mark, the next layer to be etched and a layer of photoresist have been deposited over that alignment mark. The alignment mark may be obscured, particularly if the next layer to be etched is opaque.

One solution is to perform an open-frame etch. Such an etch step etches the obscuring layers in the area of the reference mark only and not in the active device area. This technique calls for an additional photomask and a pattern and etch step, which is undesirable.

As described in Chen et al., U.S. patent application Ser. No. 11/097,496, "Masking of Repeated Overlay and Alignment Marks to Allow Reuse of Photomasks in a Vertical Structure," filed Mar. 31, 2005 and hereby incorporated by reference, alignment marks are typically very large compared to device features, and, due to process differences within and outside the array area, it may be possible to locate obscured alignment marks by transferred topography; i.e. the next layer to be etched may be higher directly above the alignment mark than adjacent to the alignment mark, and this elevated area may be detectable.

A measured overlay mark, which is formed in photoresist, is on the top layer and is always unobscured. Sometimes, during overlay mark measurement, the target overlay mark is covered solely by transparent material. Silicon dioxide, the dielectric material most commonly used in integrated circuit fabrication, is transparent, and photoresist is nearly transparent. In this case the overlay marks can be located visually. In other cases, however, the target overlay mark is covered by one or more layers when it is to be located, and is not visible.

It was noted that when an alignment mark or target overlay mark is obscured by one or more opaque layers, it can be located by transferred topography incidentally created. In the present invention, a dummy structure is formed to intentionally create topography in the form of a raised area of dielectric material, which is transferred to later deposited layers. This topography is used to locate an obscured alignment or overlay mark.

Figure 5:
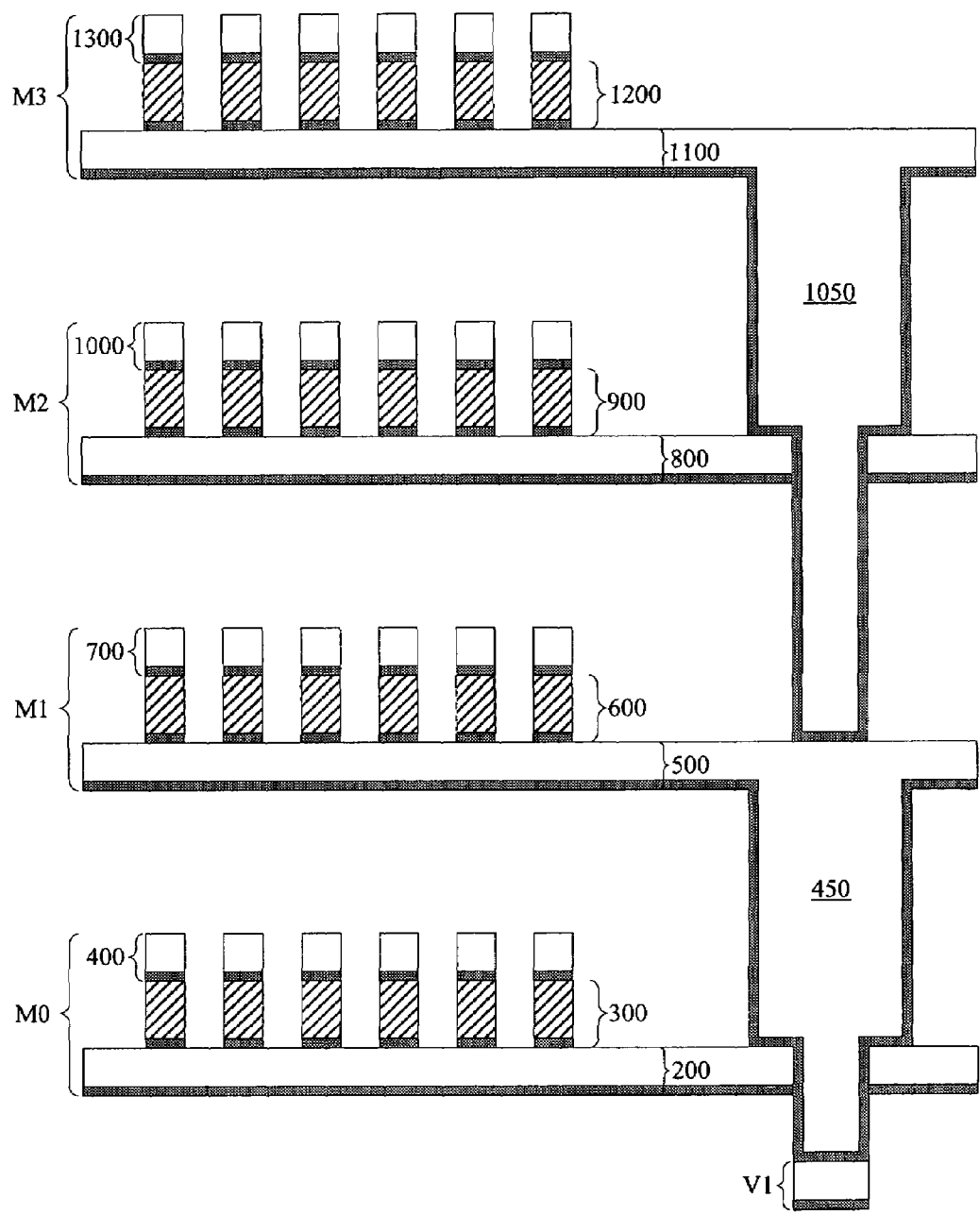
FIG. 5 is a cross-sectional view of a monolithic three dimensional memory array.

For example, FIG. 5 is a cross-sectional view of four memory levels M0, M1, M2, and M3, each formed like the memory level shown in FIG. 2. Vertical interconnects 450 and 1050 are shown as well, as is routing layer V1. After top conductors 400 of memory level M0 have been formed, dielectric material (not shown) is deposited, the void in which via 450 is to be formed is etched, and the conductive layerstack that will form bottom conductors 500 of memory level M1 are deposited. A layer of photoresist is deposited on the conductive layerstack, and then, to pattern and etch bottom conductors 500, a photomask must be aligned to an alignment mark in the previous etched layer. This alignment mark was formed along with top conductors 400, and has been covered by dielectric material (which is generally transparent), by the conductive layerstack that will form bottom conductors 500, and by photoresist. In preferred embodiments, the layers of the conductive layerstack are titanium nitride and tungsten, which are opaque. The alignment mark formed with top conductors 400 thus is not visible.

According to aspects of the present invention a dummy structure can be formed in a lower layer to ensure that there is sufficient transferred topography that the obscured alignment mark can readily be located.

Fabrication begins above a substrate, for example a monocrystalline silicon wafer. Support circuitry may be formed in the wafer substrate. An insulating layer is formed over the substrate and planarized, and fabrication of the first memory level (M0 of FIG. 5) begins on this planarized dielectric surface.

Still referring to FIG. 5, a conductive layerstack is deposited, then patterned and etched to form substantially parallel, substantially coplanar bottom conductors 200. In preferred embodiments, the conductive layerstack includes a tungsten layer formed on top of a titanium nitride adhesion layer. Dielectric material is deposited over and between bottom conductors 200, then a CMP step coexposes the tops of bottom conductors 200 and the dielectric fill at a substantially planar surface.

Next, in preferred embodiments, a titanium nitride barrier layer is deposited, followed by deposited semiconductor material, for example silicon. The silicon and titanium nitride layers are patterned and etched to form pillars 300. Dielectric material is deposited over and between pillars 300, then a CMP step coexposes the tops of pillars 300 and the dielectric fill at a substantially planar surface. In order to form vertically oriented diodes in pillars 300, the bottom region of the silicon layer is in situ doped, for example with an n-type dopant such as phosphorus. A center region is undoped. After the CMP step exposing the tops of pillars 300, a top heavily doped region of the opposite conductivity type is formed, preferably by ion implantation, for example of ions of boron or $BF_2$, forming a vertically oriented p-i-n diode.

Referring to FIG. 5, recall that an alignment structure (not shown) will be formed during the etch of top conductors 400 (the next layer to be formed) which will be obscured by the layerstack that will form bottom conductors 500 of memory level M1. It is desirable to increase topography above the alignment structure to be formed.

Figure 6A:
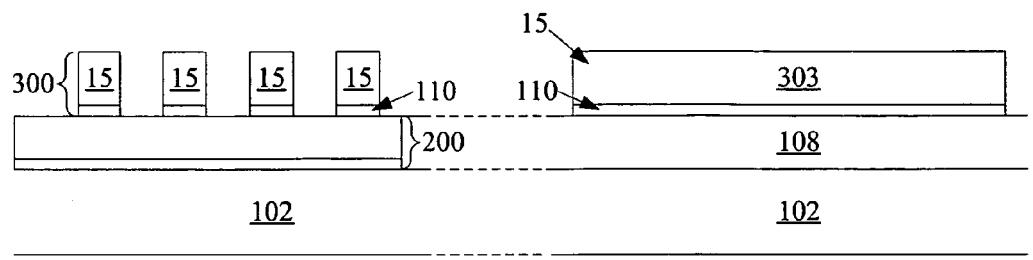
FIGS. 6a-6g are cross-sectional views illustrating stages in formation of a memory level in which methods according to an embodiment of the present invention are used to locate in alignment mark obscured by a deposited layer.

FIG. 6a is a cross-sectional view of bottom conductors 200 and pillars 300. Bottom conductors 200 are shown in cross-section, extending left to right across the page, formed above insulating layer 102. Insulating layer 102 is formed above a suitable substrate (not shown), for example a monocrystalline silicon wafer. A dummy structure 303 was formed of the same materials (a titanium nitride barrier layer 110 and a silicon layerstack 15) and during the same pattern and etch step that formed pillars 300. Pillars 300 are formed in the array area, while dummy structure 303 is formed outside the array area. As will be seen, dummy structure 303 is formed underneath where the upcoming alignment structure of top conductor layer 400 will be formed. Dummy structure 303 may be formed some distance away from the array area, as indicated by the broken lines.

Figure 6B:
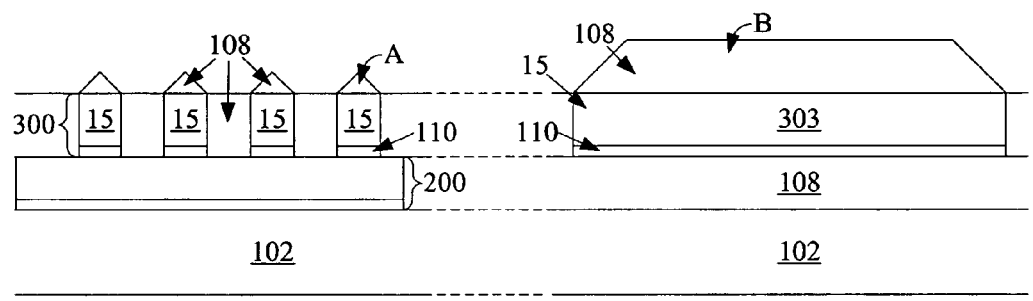

As shown in FIG. 6b, dielectric material 108 is deposited over and between pillars 300 (which are patterned features) and dummy structure 303. In preferred embodiments, dielectric material 108 is deposited by an HDP method; for example dielectric material 108 may be HDP oxide. Preferably the amount of deposition is adapted so that discrete volumes of dielectric material form directly on top of each pillar 300, and a larger volume of dielectric material forms directly above dummy structure 303. (The word "above" means at a higher level above a reference surface, for example a substrate. In this discussion the term "directly above" an object will mean at a higher level above the reference surface and on a line through the object perpendicular to that substrate. For example, volume A of dielectric material 108 is above dummy structure 303, while volume B of dielectric material 108 is directly above dummy structure 303. Something that is "directly above" an object need not be in immediate contact with that object, however; some other layer or structure may intervene.)

Figure 6C:
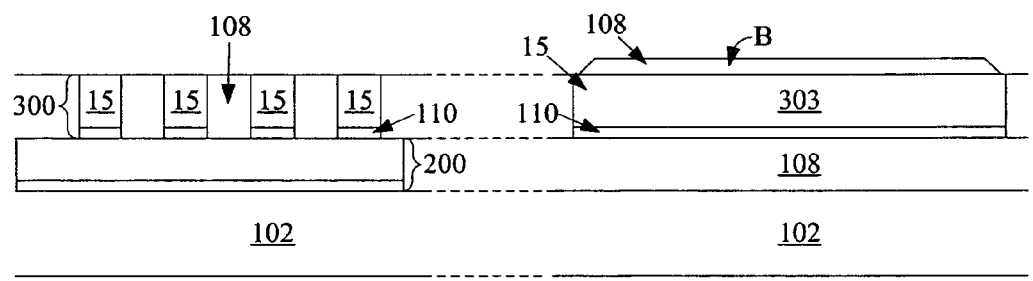

As shown in FIG. 6c, the CMP step removes dielectric material 108 from directly above pillars 300, exposing tops of pillars 300. Preferably, though, some amount of volume B remains directly above dummy structure 303. As noted earlier, the shapes of volume A and volume B means that there is more volume of dielectric material over a given area of dummy structure 303 than over each pillar 300. Ion implantation of a p-type dopant in the top region of pillars 300 completes formation of the vertically oriented diode. In some embodiments, a dielectric rupture antifuse (not shown) may be formed at this point, preferably by thermal oxidation to form a thin layer of silicon dioxide on each pillar 300.

Figure 6D:
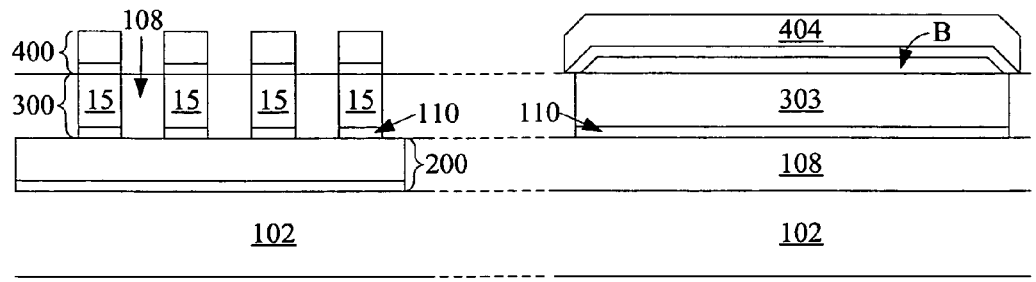

Next, as shown in FIG. 6d, a conductive layerstack (preferably of titanium nitride and tungsten) is deposited, then patterned and etched to form substantially parallel, substantially coplanar top conductors 400 and alignment structure 404. Note that alignment structure 404 is formed directly above dummy structure 303. The presence of volume B of dielectric material causes alignment structure 404 to be elevated above top conductors 400. Preferably dummy structure 303 is slightly smaller in width than alignment structure 404, as shown.

Figure 6E:
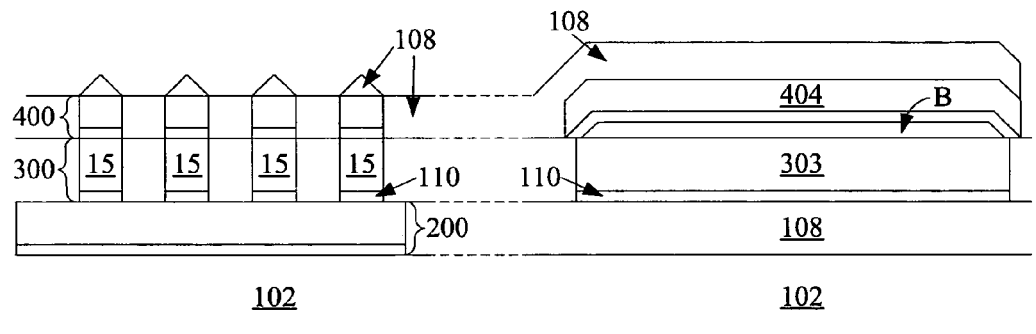

As shown in FIG. 6e, dielectric material 108 is deposited over and between top conductors 400 (which are patterned features) and alignment structure 404. In preferred embodiments, dielectric material 108 is deposited by an HDP method; for example dielectric material 108 may be HDP oxide. Preferably the amount of deposition is adapted so that discrete volumes of material form directly on top of each conductor 400, and a larger volume of material forms directly above alignment structure 404.

Figure 6F:
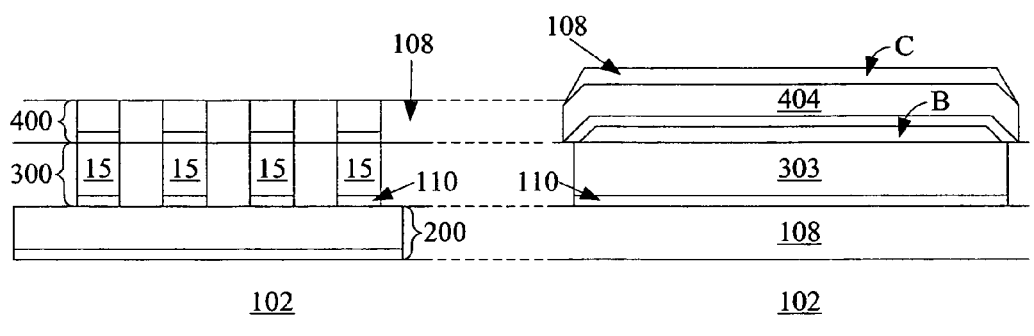

As shown in FIG. 6f, after a CMP step, which exposes the tops of top conductors 400, a volume C of dielectric material 108 remains directly above alignment structure 404. Referring to FIG. 5, first memory level M0 has been completed. (Note that alignment and dummy structures are not shown in FIG. 5.)

Figure 6G:
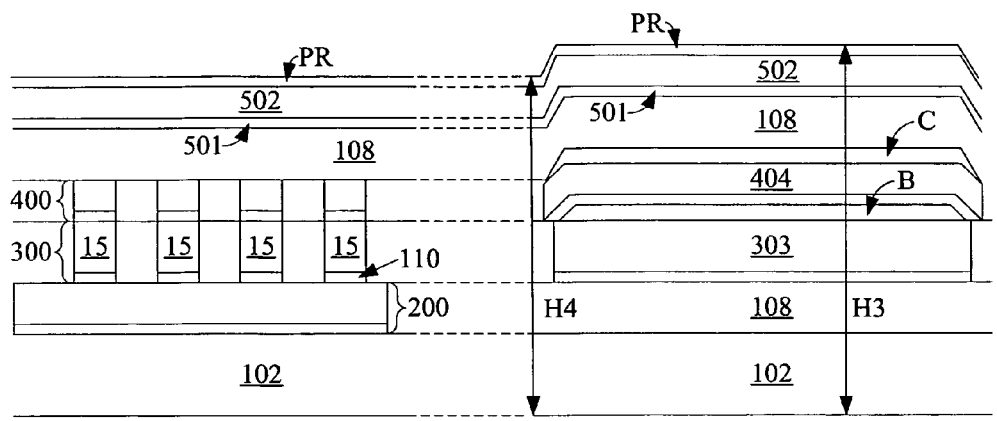

Turning to FIG. 6g, more dielectric material 108 is deposited over memory level M1. Bottom conductors 500 (shown in FIG. 5) are to be formed next. A conductive layerstack including titanium nitride layer 501 and tungsten layer 502 is deposited next. This layer will be patterned and etched to form bottom conductors 500 (of memory level M1), so photoresist PR is deposited on tungsten layer 502.

Next a photomask must be aligned to alignment structure 404. Alignment structure 404 is covered by dielectric material 108, which is transparent, and titanium nitride layer 501 and tungsten layer 502, which are opaque.

As will be seen in FIG. 6g, however, the top surface of photoresist layer PR, which was deposited above alignment structure 404, and above dielectric material 108, has one height H3 directly above alignment structure 404 and dummy structure 303, and a different height H4 adjacent to alignment structure 404 and dummy structure 303. H3 is higher than H4. The edge or boundary between heights H3 and H4 can be detected by red or green light in the scanner, allowing alignment mark 404 to be located without any need to perform an open-frame etch.

Formation of second memory level M1 continues, and additional memory levels may be formed stacked above memory levels M0 and M1, forming a monolithic three dimensional memory array.

The alignment structure was located by: forming a dummy structure in a first deposited layer; depositing first dielectric material above the dummy structure, the first dielectric material having a top surface; performing a first CMP step on the first dielectric material, wherein, after the first CMP step, the top surface of the first dielectric material has a first height directly above the dummy structure and a second height adjacent to the dummy structure, the first height greater than the second height; forming the alignment structure directly above the dummy structure and above the first dielectric material; depositing a second layer having a top surface above the alignment structure, wherein the top surface of the second layer has a third height directly above the alignment structure and a fourth height adjacent to the alignment structure, the third height greater than the fourth height; and locating the alignment mark by identifying a boundary between the third height and the fourth height. The same method could be used to locate an overlay structure instead.

In the example just described, the second layer was a layer of photoresist; it could also be a layer of a conductor (such as a metal) or a semiconductor material.

EXAMPLE

Second Embodiment

Figure 7A:
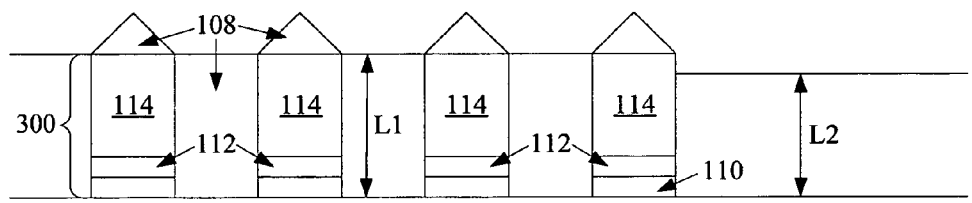
FIGS. 7a-7c are cross-sectional views illustrating overpolish of features near the outside of an array area during formation of a memory level when methods of the present invention are not used.

Turning to FIG. 7a, it will be recalled that pillars 300, each of which in preferred embodiments includes a vertically oriented p-i-n diode, are formed by depositing a semiconductor layerstack including heavily doped n-type region 112 and intrinsic region 114 over barrier layer 110, patterning and etching regions 114 and 112 and barrier layer 110 to form the pillars 300, performing CMP to remove overfill and expose the tops of pillars 300, and completing the diodes by forming a top heavily doped p-type region 116 by ion implantation. FIG. 7a shows the pillars after dielectric material 108 has been deposited and before the CMP step has been performed to remove overfill.

Dielectric material 108 is deposited at a roughly equal rate inside and outside the array area. Within the array area, the volume of the pillars 300 displaces some volume of dielectric material 108, while outside the array area, no such volume is displaced. It will be seen, then, that the level L1 of dielectric material 108 between features in the array area is higher than its level L2 outside the array area.

Figure 7B:
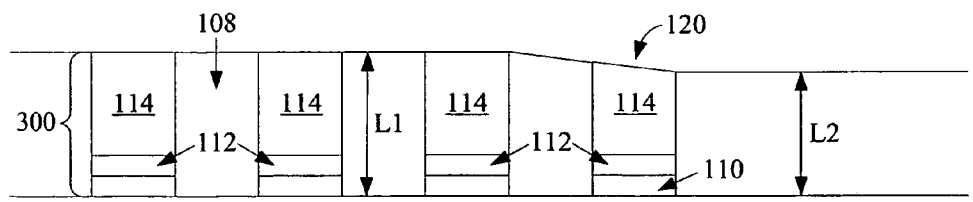
Figure 7C:
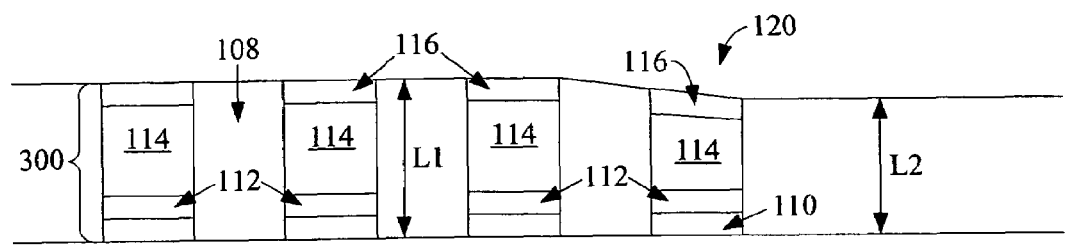

Turning to FIG. 7b, during the CMP step, the lower level L2 outside of the array area will tend to cause the outer row of pillars 120 to be overpolished, making them shorter than the remaining pillars 300 inside the array area. As a result, as shown in FIG. 7c, after the ion implantation step that forms heavily doped region 116, the intrinsic region 114 is thinner in those outer pillars. Intrinsic region 114 prevents reverse leakage current through the diode; thus the diodes having thinner intrinsic regions 114 will behave differently than the other diodes, having higher leakage current.

Nonuniformity in behavior across memory cells is highly disadvantageous in a memory array. One approach to solve this problem would be to form a dummy structure in the same layer as the pillars outside of the array area, so that the level L2 of dielectric material outside the array area is the same as the level L1 inside the array area. At times, however, design constraints may make the use of dummy structures at this level impossible. For example, if dummy conductors are used in formation of bottom conductors 200 and top conductors 400, dummy pillars would short those dummy conductors together.

In the present embodiment of the present invention, an alternative solution is to form a dummy structure in a lower layer to create topography which is transferred to the present layer.

Figure 8A:
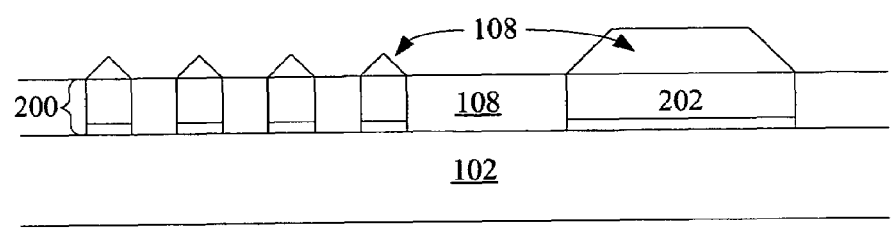
FIGS. 8a-8d are cross-sectional views illustrating an embodiment of the present invention in which a dummy structure is used to create topography which prevents the overpolish shown in FIGS. 7a-7c.

Turning to FIG. 8a, a conductive layerstack is deposited, patterned and etched to form bottom conductors 200, which are patterned features in an array area. Bottom conductors 200 are shown in cross-section extending out of the page. A dummy structure 202 is formed during the same pattern and etch steps, and is formed of the same conductive layerstack. Dielectric material 108 is deposited over and between bottom conductors 200 and dummy structure 202. As will be seen in FIG. 8a, small volumes of dielectric material 108 are formed on top of pillars 300, while a larger volume of dielectric material 108 is formed directly above dummy structure 202. As noted earlier, due to the angled edges of these dielectric volumes, a larger volume of dielectric material per unit area forms above larger structures than above smaller structures.

Figure 8B:
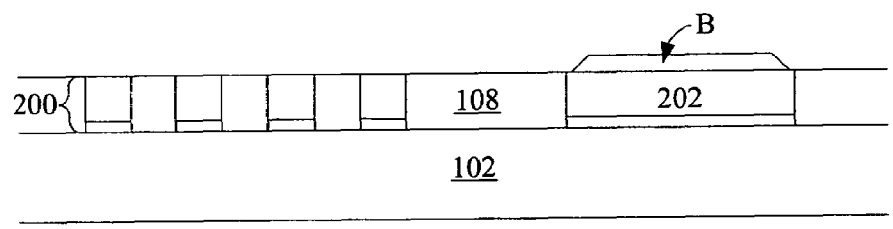

Turning to FIG. 8b, a CMP step is performed to expose the top surfaces of conductors 200. This CMP step can be controlled such that a volume B of dielectric material remains directly above dummy structure 202 after the CMP step is finished. In preferred embodiments, this CMP step is performed with a soft pad; an example of a suitable pad is the Politex Prima pad from Rohm and Haas. The soft pad conforms to the surface, spreading energy over a larger area, reducing the force per unit area, and is better adapted to preserve dielectric volume B.

Figure 8C:
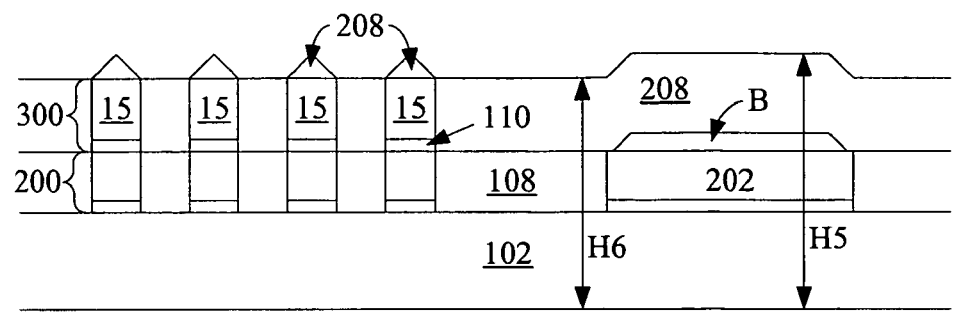

Next, as shown in FIG. 8c, barrier layer 110 and a semiconductor layerstack 15, which includes a heavily doped n-type region and an intrinsic region, is deposited on exposed conductors 200. Semiconductor layerstack 15 and barrier layer 110 are patterned and etched to form pillars 300. Dielectric material 208 is deposited over pillars 300.

Figure 8D:
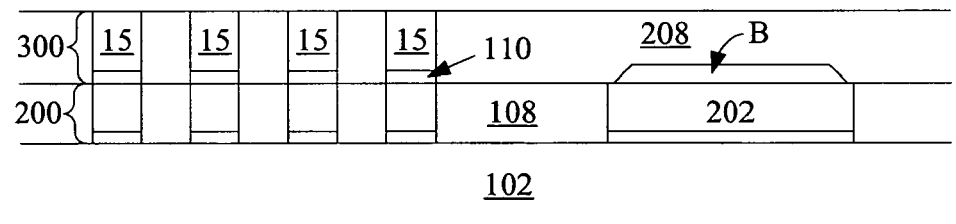

It will be seen that the top surface of dielectric material 208 has a one height, H5, directly above dummy structure 202, and a different height, H6, adjacent to dummy structure 202. Turning to FIG. 8d, when CMP is performed to remove overfill of dielectric material 208 and expose the tops of pillars 300, the additional height of dielectric material over 208 directly above dummy structure 202 and dielectric volume B prevents the overpolish of outer pillars shown in FIG. 7b. Preferably a more rigid pad is used for this CMP step; an example of a suitable pad is the IC 1000 from Rohm and Haas.

Figure 9:
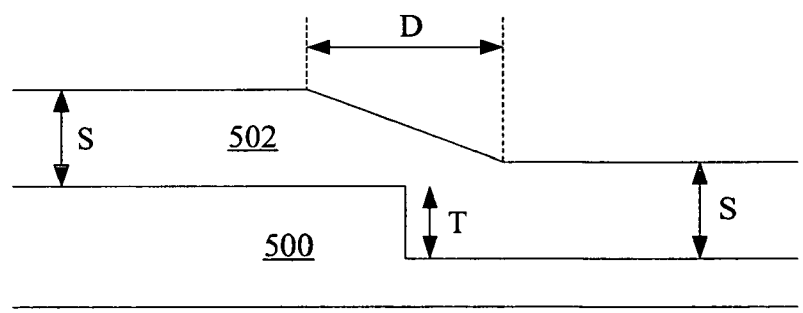
FIG. 9 is a cross-sectional view illustrating planarization relaxation length.

The location of dummy structure 202 in relation to the array area is determined by the planarization relaxation distance during CMP of dielectric 208 over the pillars 300. Turning to FIG. 9, suppose there is a step of height T in a first layer 500, a layer 502 having thickness S is deposited over first layer 500, and the layer 502 is subjected to planarization. On the low side of the step, the height of the top surface of layer 502 is S, while on the high side of the step, the height of the top surface of layer 502 is S+T. The transition between these heights is not an abrupt step in layer 502, however; instead it is a slope. The distance D between height S and height S+T at the top surface of layer 502 will be called the planarization relaxation distance. The planarization relaxation distance depends on parameters of the CMP process, including the slurry and the pad. Use of a softer pad increases the planarization relaxation distance, for example. To be effective at preventing the overpolish shown in FIG. 7b, dummy structure 202 should be placed within the planarization relaxation distance of the outermost pillars 300 for that CMP step.

The exposed pillars 300 are doped by ion implantation, completing the diodes. Top conductors will be formed as described earlier to complete this memory level. Additional memory levels can be formed stacked above the first memory level to form a monolithic three dimensional memory array.

When structures formed of tungsten are very large they become prone to peeling. Peeling can be prevented by breaking such a structure into a series of small features formed in close proximity. If a dummy structures used according to the present invention is formed of tungsten, it may be desirable for the tungsten dummy structure to take the form of a series of small features formed in close proximity. Use of such a collection of small features in close proximity which serves to create topography transferred to a later deposited layer will fall within the scope of the invention.

Two preferred embodiments have been described, but it will be apparent to those skilled in the art that the methods of the present invention may be useful in other contexts to create advantageous transferred topography in deposited layers.

In both of the embodiments described, a dielectric material is deposited over patterned features and a dummy structure, forming an excess dielectric volume on the dummy structure; then dielectric overfill is removed to expose tops of the patterned features. In the examples provided, the dielectric overfill was removed by CMP. Alternatives exist, however. As described in Raghuram et al., U.S. patent application Ser. No. 10/883,417, "Nonselective Unpatterned Etchback to Expose Buried Patterned Features," filed Jun. 30, 2004, and hereby incorporated by reference, HDP dielectrics, when deposited to sufficient thickness, tend to be self-planarizing. In an alternative embodiment, dielectric material may be deposited over patterned features and a dummy structure to a depth sufficient to be self-planarizing over patterned features while retaining excess volume of dielectric material over the larger dummy structure. Etchback preserves existing topography; thus an etchback step such as that described in Raghuram et al. can be used to remove the overfill of dielectric material. Once the patterned features are exposed by etchback, a volume of dielectric material will remain over the dummy structure.

In both of the embodiments described, and in other embodiments, advantageous topography was created in deposited layers above a substrate by etching a first deposited layer to form a dummy structure above the substrate, the dummy structure adapted to form excess dielectric volume on top of the dummy structure during dielectric deposition; depositing first dielectric material having a top surface above the first deposited layer, wherein a first height of the top surface of first dielectric material directly above the dummy structure is higher above the substrate than a second height of the top surface of first dielectric material adjacent to the dummy structure; performing a first CMP step on the first dielectric material, wherein, after the first CMP step, the first height remains higher than the second height; and, after the first CMP step, depositing a second layer having a top surface above the first dielectric material, wherein a third height of the top surface of the second layer directly above the dummy structure is higher above the substrate than a fourth height of the top surface of the second layer adjacent to the dummy structure.

In some embodiments, the second layer is dielectric material, while in other embodiments, the second layer is some other material.

Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method to create topography in material deposited above a wafer substrate, the method comprising:
    etching a first deposited layer to form a dummy structure above the substrate, the dummy structure adapted to form excess dielectric volume on top of the dummy structure during dielectric deposition;
    depositing first dielectric material having a top surface above the first deposited layer, wherein a first height of the top surface of first dielectric material directly above the dummy structure is higher above the substrate than a second height of the top surface of first dielectric material adjacent to the dummy structure;
    performing a first CMP step on the first dielectric material, wherein, after the first CMP step, the first height remains higher than the second height; and,
    after the first CMP step, depositing a second layer having a top surface above the first dielectric material, wherein a third height of the top surface of the second layer directly above the dummy structure is higher above the substrate than a fourth height of the top surface of the second layer adjacent to the dummy structure.

2. The method of claim 1 wherein the dummy structure is formed outside of an array area, and, during the etching step, a plurality of first features are etched from the first layer in the array area.

3. The method of claim 2 wherein the second layer is second dielectric material.

4. The method of claim 3 wherein second features are formed in the array area after the first CMP step and before the step of depositing a second layer, and wherein the second dielectric material is deposited on and between the second features.

5. The method of claim 4 further comprising performing a second CMP step on the second layer.

6. The method of claim 2 further comprising, after the first CMP step and before the step of depositing the second layer:
    depositing a third layer on the first dielectric material; and
    patterning and etching the third layer to form:
        a) second features in the array area, and
        b) an alignment or overlay structure directly above the dummy structure.

7. The method of claim 6 wherein the second layer is not dielectric material.

8. The method of claim 7 further comprising detecting a boundary between the third height and the fourth height, and using the boundary to locate the alignment or overlay structure.

9. A method to locate a buried overlay or alignment structure, the method comprising:
    forming a dummy structure in a first deposited layer;

depositing first dielectric material above the dummy structure, the first dielectric material having a top surface;

performing a first CMP step on the first dielectric material, wherein, after the first CMP step, the top surface of the first dielectric material has a first height directly above the dummy structure and a second height adjacent to the dummy structure, the first height greater than the second height;

forming the overlay or alignment structure directly above the dummy structure and above the first dielectric material;

depositing a second layer having a top surface above the overlay or alignment structure, wherein the top surface of the second layer has a third height directly above the overlay or alignment structure and a fourth height adjacent to the overlay or alignment structure, the third height greater than the fourth height; and locating the overlay or alignment mark by identifying a boundary between the third height and the fourth height.

10. The method of claim 9 wherein the dummy structure is formed outside of an array area, and wherein the array area comprises first patterned features.

11. The method of claim 10 wherein the first features are portions of a first device level.

12. The method of claim 11 wherein the first device level has at least a second device level monolithically formed above it in a monolithic three memory dimensional array.

13. A method to produce topography in material deposited above a wafer substrate, the method comprising:

depositing a first layerstack;

etching the first layerstack to form first features in an array area and a dummy structure outside of the array area;

depositing first dielectric material over the first features and the dummy structure;

planarizing the first dielectric material to expose the first features wherein, after the planarizing step, a first thickness of dielectric material remains directly on top of the dummy structure;

depositing a second layerstack above the first features and the dummy structure;

patterning and etching the second layerstack to form second features; and depositing second dielectric material having a top surface above the second features and the dummy structure, wherein the top surface of second dielectric material has a first height directly above the dummy structure and a second height adjacent to the dummy structure, the first height higher above the substrate than the second height.

14. The method of claim 13 wherein the planarizing step comprises CMP.

15. The method of claim 13 wherein the first features are substantially parallel, substantially coplanar lines.

16. The method of claim 15 wherein the second features are pillars.

17. The method of claim 16 wherein the pillars comprise deposited semiconductor material.

18. The method of claim 17 wherein, in the completed device, each of the pillars comprises a vertically oriented diode.

19. The method of claim 13 wherein the first features and second features are portions of a first memory level.

20. The method of claim 19 wherein the first memory level has at least a second memory level monolithically formed above it in a monolithic three dimensional memory array.

* * * * *